United States Patent
Ruelke et al.

(10) Patent No.: US 7,326,646 B2
(45) Date of Patent: Feb. 5, 2008

(54) NITROGEN-FREE ARC LAYER AND A METHOD OF MANUFACTURING THE SAME

(75) Inventors: Hartmut Ruelke, Dresden (DE); Katja Huy, Dresden (DE); Sven Muehle, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 316 days.

(21) Appl. No.: 11/035,112

(22) Filed: Jan. 13, 2005

(65) Prior Publication Data

US 2005/0208755 A1    Sep. 22, 2005

(30) Foreign Application Priority Data

Mar. 16, 2004    (DE)    ............ 10 2004 012 798

(51) Int. Cl.
*H01L 21/4763*    (2006.01)
(52) U.S. Cl. .............. 438/636; 438/72; 438/952; 257/E21.029
(58) Field of Classification Search ............. 438/636, 438/72, 952; 257/E21.029
See application file for complete search history.

(56) References Cited

U.S. PATENT DOCUMENTS

| 5,888,593 | A * | 3/1999 | Petrmichl et al. ......... 427/563 |
| 6,316,167 | B1 * | 11/2001 | Angelopoulos et al. ..... 430/313 |
| 6,514,667 | B2 * | 2/2003 | Angelopoulos et al. .... 430/271.1 |
| 6,853,043 | B2 * | 2/2005 | Yeh et al. .................... 257/437 |
| 7,001,833 | B2 * | 2/2006 | Bao et al. .................... 438/597 |
| 2002/0012876 | A1 * | 1/2002 | Angelopoulos et al. .... 430/271.1 |
| 2002/0155386 | A1 | 10/2002 | Xu et al. ..................... 430/312 |
| 2002/0173172 | A1 | 11/2002 | Loboda et al. .............. 438/786 |
| 2004/0009676 | A1 | 1/2004 | Kim et al. ................... 438/778 |
| 2004/0087139 | A1 * | 5/2004 | Yeh et al. ................... 438/636 |
| 2004/0099954 | A1 | 5/2004 | Chen et al. ................. 257/758 |
| 2004/0185674 | A1 * | 9/2004 | M'Saad et al. ............. 438/761 |
| 2005/0130411 | A1 * | 6/2005 | Bao et al. .................... 438/637 |
| 2006/0024955 | A1 | 2/2006 | Frohberg et al. ........... 438/636 |

FOREIGN PATENT DOCUMENTS

WO    WO 2004/055881    7/2004

OTHER PUBLICATIONS

Office Action dated Jun. 19, 2007 from U.S. Appl. No. 11/112,499.
Official Action dated Aug. 9. 2007 from German Patent Application No. 10 2004 012 798.0-33.

* cited by examiner

*Primary Examiner*—Michael Lebentritt
*Assistant Examiner*—Stanetta Isaac
(74) *Attorney, Agent, or Firm*—Williams, Morgan & Amerson, P.C.

(57) ABSTRACT

The present invention provides a nitrogen-free ARC layer, which is formed on the basis of silane and carbon dioxide by PECVD in a nitrogen-free deposition atmosphere. The optical characteristics may be tuned in a wide range, wherein, in particular, a back reflection into the resist is maintained at 3% or less. The ARC layer is well suited for 193 nm lithography.

27 Claims, 5 Drawing Sheets

NITROGEN-FREE ARC LAYER AND A METHOD OF MANUFACTURING THE SAME

BACKGROUND OF THE INVENTION

1. Field of the Invention

Generally, the present invention relates to the formation of integrated circuits, and, more particularly, to patterning dielectrics used in metallization layers by means of sophisticated lithography with appropriate ARC layers.

2. Description of the Related Art

In modern integrated circuits, minimum feature sizes, such as the channel length of field effect transistors, have reached the deep sub-micron range, thereby steadily increasing performance of these circuits in terms of speed and/or power consumption. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines have to be reduced to compensate for a reduced amount of available floor space and for an increased number of circuit elements provided per chip.

In integrated circuits having minimum dimensions of approximately 0.35 µm and less, a limiting factor of device performance is the signal propagation delay caused by the switching speed of the transistor elements. As the channel length of these transistor elements has now reached 0.09 µm and less, it turns out, however, that the signal propagation delay is no longer limited by the field effect transistors but is limited, owing to the increased circuit density, by the close proximity of the interconnect lines, since the line-to-line capacitance is increased in combination with a reduced conductivity of the lines due to their reduced cross-sectional area. The parasitic RC time constants therefore require the introduction of a new type of materials for forming the metallization layer.

Traditionally, metallization layers are formed by a dielectric layer stack including, for example, silicon dioxide and/or silicon nitride, with aluminum as the typical metal. Since aluminum exhibits significant electromigration at higher current densities than may be necessary in integrated circuits having extremely scaled feature sizes, aluminum is being replaced by copper, which has a significantly lower electrical resistance and a higher resistivity against electromigration. For devices having feature sizes of 0.09 µm and less, it turns out that simply replacing aluminum with copper does not provide the required decrease of the parasitic RC time constants, and, therefore, the well-established and well-known dielectric materials, silicon dioxide (k≈4.2) and silicon nitride (k>5), are increasingly replaced by so-called low-k dielectric materials. However, the transition from the well-known and well-established aluminum/silicon dioxide metallization layer to a low-k dielectric/copper metallization layer is associated with a plurality of issues to be dealt with.

For example, copper may not be deposited in relatively high amounts in an efficient manner by well-established deposition methods, such as chemical and physical vapor deposition. Moreover, copper may not efficiently be patterned by well-established anisotropic etch processes. Therefore, the so-called damascene technique is frequently employed in forming metallization layers including copper lines. Typically, in the damascene technique, the dielectric layer is deposited and then patterned with trenches and vias that are subsequently filled with copper by plating methods, such as electroplating or electroless plating. Although the damascene technique is presently a well-established technique for forming copper metallization layers in standard dielectric materials, such as silicon dioxide, the employment of low-k dielectrics, however, requires the development of new dielectric diffusion barrier layers to avoid copper contamination of adjacent material layers, as copper readily diffuses in a plurality of dielectrics. Although silicon nitride is known as an effective copper diffusion barrier, silicon nitride may not be considered as an option in low-k dielectric layer stacks owing to its high permittivity. Therefore, silicon carbide is presently deemed as a viable candidate for a copper diffusion barrier. It turns out, however, that copper's resistance against electromigration strongly depends on the interface between the copper and the adjacent diffusion barrier layer. Therefore, in sophisticated integrated circuits featuring high current densities, it is generally preferable to use up to 20% nitrogen in the silicon carbide layer, thereby remarkably improving the electromigration behavior of copper compared to pure silicon carbide.

A further problem in forming low-k copper metallization layers has been under-estimated in the past and is now considered a major challenge in the integration of low-k dielectrics. During the patterning of the low-k dielectric material, advanced photolithography is required to image the structure, including vias and/or trenches, into the photoresist that is sensitive in the deep UV range. However, in developing the photoresist, certain portions of the resist which have been exposed may not be completely removed as required and thus the structure may not be correctly transferred into the underlying low-k dielectric material during the subsequent etch process. The effect of insufficiently exposing and developing the photoresist is also referred to as resist poisoning. It is believed that a significant change of the resist sensitivity may be caused by an interaction of nitrogen and nitrogen radicals with the resist layer, thereby locally modifying the resist structure after resist development. The problem is becoming even more important as the wavelength of the lithography used is reduced as a consequence of more sophisticated process requirements. For instance, currently, the patterning of critical features sizes of cutting edge devices may be performed on the basis of a 193 nm light source, requiring appropriately designed photoresists that are highly sensitive in this wavelength range. It turns out, however, that, with increased sensitivity at shorter wavelengths, the available photoresists also exhibit an increased sensitivity for resist poisoning mechanisms. Since the introduction of the 90 nm technology may also require a correspondingly advanced lithography in the formation of a metallization layer contacting the circuit elements, increased problems may occur during the patterning of the low-k dielectric as nitrogen and/or nitrogen compounds may readily be present within the low-k material and other layers in the layer stack, which then may interact with the resist exhibiting the increased sensitivity to resist poisoning.

With reference to FIGS. 1a-1c, a typical conventional process flow will now be described to explain the problems involved in patterning a metallization layer by advanced photolithography in more detail.

FIG. 1a schematically shows a cross-sectional view of a typical conventional semiconductor device 100 in which a low-k dielectric material layer 106 is to be patterned by means of an advanced photolithography in which, for instance, a 193 nm light source is used. The semiconductor device 100 comprises a substrate 101, which may have formed thereon one or more circuit elements that may, in sophisticated devices, have critical dimensions of 0.1 µm and significantly less. For convenience, a corresponding circuit element is not illustrated in FIG. 1a. Formed above the substrate 101 is an interlayer dielectric 102, which may, for instance, be comprised of silicon dioxide, silicon nitride and the like, and which has formed therein a metal-containing region 103 providing electrical contact to one or more circuit elements within the substrate 101. The region 103 may be comprised of tungsten, tungsten silicide, or any other appropriate contact metal that is well known in the art. An etch stop layer 104, for instance comprised of silicon nitride, silicon carbide, nitrogen-enriched silicon carbide, and the like, may be formed on the interlayer dielectric 102. When the low-k dielectric layer 106 and the interlayer dielectric 102 exhibit a sufficiently high etch selectivity with respect to a specified etch chemistry used for patterning the low-k dielectric layer 106, the etch stop layer 104 may be omitted.

An anti-reflective coating (ARC) layer 105 is located on top of the dielectric layer 106, wherein the ARC layer 105 is comprised of, for example, silicon oxynitride. Optical characteristics of the ARC layer 105 are tuned in accordance with the requirements of a subsequent photolithography process to be performed to pattern the ARC layer 105 and the underlying dielectric layer 106. For example, the index of refraction in combination with a thickness of the ARC layer 105 is selected with respect to an exposure wavelength of the subsequent photolithography to reduce back reflection from a bottom surface 107a of a resist layer 107 that is formed on the ARC layer 105, wherein, according to the required optical resolution of the lithography process, the resist layer 107 is selected for a specified exposure wavelength.

As previously discussed, for sophisticated applications, the 248 nm lithography is increasingly being replaced by a 193 m lithography, so that the resist layer 107 exhibits an enhanced sensitivity in this wavelength range, however, at the price of also exhibiting an increased reactivity with nitrogen and nitrogen compounds. The increased reactivity of the resist layer 107 with nitrogen and nitrogen compounds may degrade the formation of an opening 108, indicated by dashed lines, which is to be formed within the resist layer 107 to form a corresponding trench in the ARC layer 105 and the dielectric layer 106.

A typical process flow for forming the semiconductor device 100 as shown in FIG. 1a may comprise the following processes. After the formation of any circuit elements in the substrate 101, the metal-containing region 103 embedded into the interlayer dielectric 102 is formed in accordance with well-established manufacturing processes. For instance, depending on the dimensions of the circuit elements which the metal-containing region 103 is connected to, a correspondingly designed lithography process has to be used, possibly on the basis of a radiation source with a wavelength of 193 nm. Thereafter, the etch stop layer 104 may be deposited by well-established deposition techniques, such as plasma enhanced chemical vapor deposition (PECVD) with a desired thickness and material composition. For instance, if silicon nitride is used as the material for the etch stop layer 104, a corresponding PECVD process may be based on precursor gases, such as silane and ammonia, for which well-approved deposition recipes are available. Moreover, the etch stop layer 104 may also act as a diffusion barrier when a via comprised of copper is to be formed in the dielectric layer 106, since, as previously discussed, copper may readily diffuse in low-k materials and in silicon dioxide. If the relatively high permittivity of silicon nitride is considered inappropriate with respect to signal propagation delay, a nitrogen-containing silicon carbide layer may be deposited on the basis of trimethylsilane (3MS) and ammonia ($NH_3$).

Thereafter, the dielectric layer 106 is formed by means of deposition and/or spin-on techniques as are required by the material composition of the dielectric layer 106. For instance, SiCOH is a frequently used material composition for low-k dielectrics, which may, depending on the microstructure of the material, be deposited by various process recipes. In other cases, the dielectric layer 106 may be formed by spin-on techniques when materials of significantly reduced permittivity are required. Thereafter, the ARC layer 105 is formed by well-established PECVD techniques wherein process parameters are controlled such that the desired optical behavior of the ARC layer 105 is obtained. That is, during the deposition, the ratio of nitrogen and oxygen in the ARC layer 105 is adjusted to achieve, in combination with a specified layer thickness, a low back reflection from the surface 107a at the exposure wavelength under consideration. In some conventional approaches, the ARC layer 105 is formed by spin-on techniques with nitrogen-depleted materials, wherein, however, a poor etch selectivity to the layer 106 may result in subsequent etch processes. Next, the resist layer 107 is formed by spin-on techniques including any appropriate pre-exposure processes.

As is evident from the above description, nitrogen is incorporated in a plurality of layers, such as the etch stop layer 104 and the ARC layer 105, and may also be present in varying amounts in the form of nitrogen, nitrogen compounds and nitrogen radicals in the dielectric layer 106, as these materials are typically present in any processes for forming the layers 104 and/or 106 and/or 105. The nitrogen and corresponding compounds may readily diffuse into the resist layer 107 or the nitrogen may come directly into contact with the resist layer 107 as it represents a considerable amount of the stoichiometric composition of the ARC layer 105. Hence, the nitrogen may interact with the resist material, thereby degrading the sensitivity of the resist with respect to an exposure wavelength to be subsequently used. In particular, a resist designed for a 193 nm exposure wavelength readily reacts with nitrogen and its compounds, thereby deteriorating the non-linear behavior of the resist upon exposure. As a consequence, the dimensions of the opening 108 to be formed within the resist layer 107 may not be imaged into the resist layer 107 as precisely as is required for a subsequent patterning of the dielectric layer 106.

FIG. 1b schematically shows the semiconductor device 100 after exposure and development of the resist layer 107 to actually form the opening 108 therein. Due to the degraded optical characteristics of the resist layer 107, resist residues 108a may remain after the development of the resist layer 107, thereby affecting the contour and/or the dimensions of the opening 108. Since the resist layer 107 acts as an etch mask in a subsequent anisotropic etch process, the variation of the contour and/or dimension of the opening 108 also negatively affects the etch process, which may finally lead to a metal via of reduced reliability.

FIG. 1c schematically shows the semiconductor device 100 after completion of the anisotropic etch process for opening the ARC layer 105, the dielectric layer 106 and the etch stop layer 104. A trench 109 having a contour and dimension that may significantly deviate from the target dimension, as indicated by the dashed lines 108b, is formed within the dielectric layer 106. Since the diameter of the trench 109 may be in the range of 0.1 µm and even significantly less for a semiconductor device of a 90 nm technology, the fluctuation in lateral dimension may result in a metal line of reduced reliability, thereby adversely influencing production yield and thus production costs.

In view of the problems identified above, there is a need for an improved technique enabling the patterning of a dielectric layer without undue resist poisoning for advanced lithography using an exposure wavelength of 248 nm and even less.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a substantially nitrogen-free ARC layer to significantly reduce any resist poisoning effects in even highly sensitive photoresists. In this respect, the term "nitrogen-free," when used with respect to the material composition of a layer, is meant to describe a layer having a composition represented by a stoichiometric formula that does not include nitrogen. It should, however, be borne in mind that minute amounts of nitrogen may still be present within such a substantially nitrogen-free layer owing to a slight contamination with nitrogen caused by process tools and/or diffusion effects. However, these nitrogen impurities do not affect the optical, mechanical, chemical characteristics of the "nitrogen-free" ARC layer. Thus, a layer having a nitrogen content of less than 3 atomic percent or preferably of less than 1 atomic percent may be considered as a substantially nitrogen-free layer. The present invention is based on the concept that particularly the ARC layer formed below a resist layer may advantageously be formed of a material without any appreciable amounts of nitrogen, wherein, in particular embodiments, the ARC layer is formed by a process that does not require any nitrogen as process or carrier gas, thereby reducing the potential of contaminating the substantially nitrogen-free ARC layer.

According to one illustrative embodiment of the present invention, a method comprises determining a target value for at least one optical characteristic for an ARC layer to be formed above an interlayer dielectric of a metallization layer. Moreover, the method comprises depositing the ARC layer in a substantially nitrogen-free atmosphere on the basis of a silicon and carbon-containing precursor above the interlayer dielectric while controlling at least one process parameter on the basis of the target value.

In accordance with a further illustrative embodiment of the present invention, a method of forming an ARC layer comprises creating a deposition atmosphere on the basis of a silicon-containing precursor, carbon dioxide and a nitrogen-free carrier gas. Moreover, a plasma is generated in the deposition atmosphere and at least silicon, oxygen and carbon are deposited on a substrate to form the ARC layer.

According to still another illustrative embodiment of the present invention, a semiconductor device comprises a substrate having formed thereon a first dielectric layer including a metal-containing region that is in contact with a circuit element formed below and within the first dielectric layer. A second dielectric layer is formed above the first dielectric layer and includes a via that is in contact with the first metal-containing region. Moreover, a substantially nitrogen-free ARC layer is formed above the second dielectric layer, wherein the substantially nitrogen-free ARC layer comprises silicon, carbon and oxygen.

BRIEF DESCRIPTION OF THE DRAWINGS

The invention may be understood by reference to the following description taken in conjunction with the accompanying drawings, in which like reference numerals identify like elements, and in which.

Figure 1A:
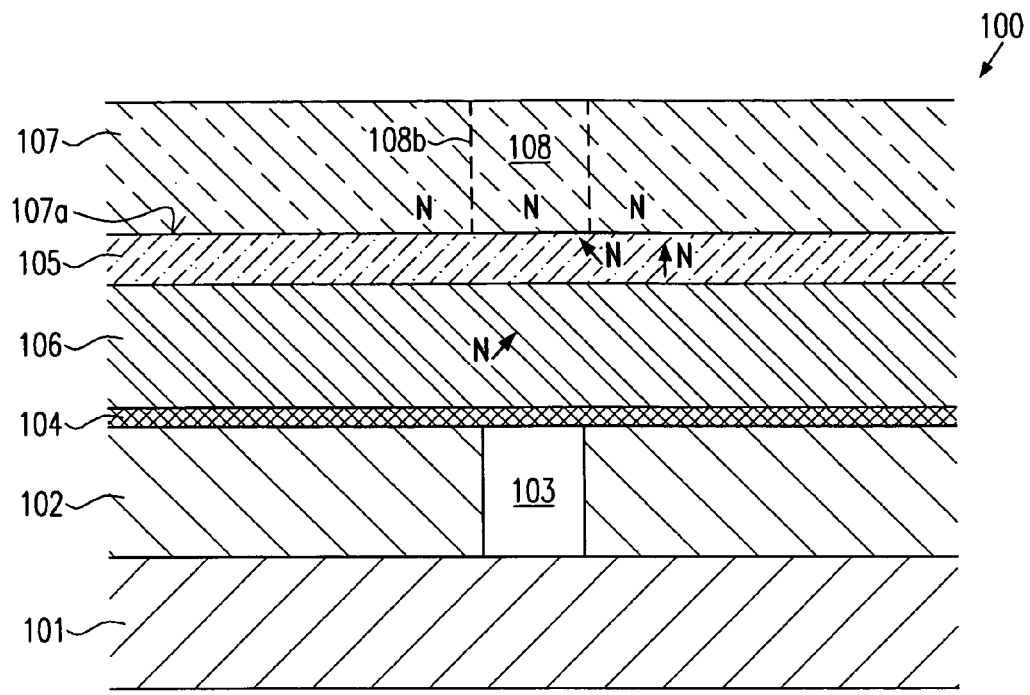
FIGS. 1a-1c schematically show cross-sectional views of a semiconductor device during the patterning of a metallization layer in accordance with conventional process strategies.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention provides a technique for significantly reducing the probability of an interaction of nitrogen and nitrogen-containing compounds with a photoresist in advanced lithography techniques requiring the application of an ARC layer formed between the photoresist layer and a material layer to be patterned. Since the effect of resist poisoning generally influences the formation of circuit features in metallization layers of highly advanced semiconductor devices, as typically low-k dielectric materials are used here in combination with photoresists that are highly sensitive to nitrogen and nitrogen containing compounds, the present invention is especially advantageous for patterning low-k dielectric materials in accordance with critical dimensions on the order of 100 nm and less. It should be appreciated, however, that, in principle, the technique disclosed herein may be applied to manufacturing processes of semiconductor devices having larger dimensions when the provision of a substantially nitrogen-free ARC layer is considered appropriate. With reference to FIGS. 2a-2c and 3a-3c, further illustrative embodiments of the present invention will now be described in more detail.

Figure 2A:
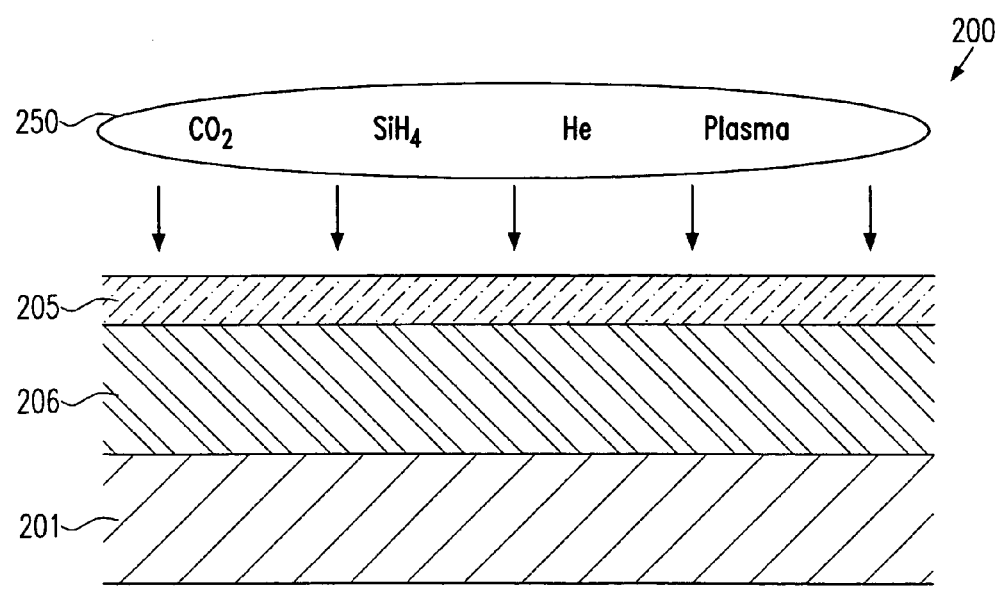
FIGS. 2a-2c schematically show cross-sectional views of a semiconductor device during various manufacturing stages for patterning a metallization layer in accordance with illustrative embodiments of the present invention.

FIG. 2a schematically shows a semiconductor structure 200 comprising a substrate 201, which may include circuit elements, such as transistors, capacitors and the like. So as to not obscure the present invention, such elements are not shown in FIGS. 2a-2c. In other examples, the substrate 201 may represent any substrate for receiving minute structure elements that have to be formed within the substrate 201 or thereon by means of advanced photolithography techniques. In particular embodiments, the substrate 201 may represent a substrate having formed thereon silicon-based circuit elements that have been fabricated by a technology characterized by a technology node of 90 nm or less. The semiconductor structure 200 further comprises a dielectric layer 206, which may represent a low-k dielectric layer of any appropriate material composition. For instance, the dielectric layer 206 may represent a polymer material having a relative permittivity of less than 3.5. In one particular embodiment, the dielectric layer 206 comprises silicon, carbon, oxygen and hydrogen, represented by the formula SiCOH, with a relative permittivity of 3.8 and less. In other cases, the dielectric layer 206 may represent any appropriate dielectric material that has to be patterned by advanced photolithography. An ARC layer 205 is formed above the dielectric layer 206 and is comprised of silicon, carbon and oxygen. The ARC layer 205 represents a substantially nitrogen-free layer in the sense that nitrogen may only be present in the layer 205 in the form of impurities that may have been introduced from the underlying layer 206 or from process tools during the formation of the ARC layer 205. Thus, contrary to the conventional ARC layer 105, in which nitrogen may represent an essential component, the ARC layer 205 is characterized by a chemical formula on the basis of silicon, carbon and oxygen, wherein any minute amounts of nitrogen do not affect any optical, mechanical, physical and/or chemical characteristics of the layer 205. In some embodiments, the ARC layer 205 may also comprise hydrogen in an amount of approximately 5 atomic percent or less.

A typical process flow for forming the semiconductor structure 200 as shown in FIG. 2a may comprise the following processes. Depending on the type of substrate and whether there are circuit elements provided thereon or not, a plurality of previous manufacturing processes, possibly on the basis of advanced photolithography techniques, may have been performed. Thereafter, the dielectric layer 206 may be formed above the substrate 201 by any appropriate technique, such as CVD deposition or spin-on methods. In some embodiments, the dielectric layer 206 may comprise a capping layer (not shown in FIG. 2a) to provide enhanced mechanical characteristics of the layer 206 and/or to improve the diffusion blocking characteristics of the layer 206. As previously pointed out, when the dielectric layer 206 is provided in the form of a low-k material, typically a plurality of materials, such as nitrogen, may readily diffuse in the capping layer, so that a densified surface portion or a different material composition may significantly reduce a diffusion through the surface of the layer 206, and may also enhance the mechanical integrity of this layer. More details on a capping layer will be provided with reference to FIG. 2c.

Thereafter, the semiconductor structure 200 is exposed to a deposition atmosphere 250, which may be established in any appropriate deposition tool that is equipped to also provide a plasma within the deposition atmosphere 250. Corresponding PECVD deposition tools are readily available and may be effectively used with the present invention. In one particular embodiment, a PECVD deposition tool from Applied Materials, available under the name Producer™, may be advantageously used. As previously discussed, for obtaining a low nitrogen impurity rate in the layer 205, a corresponding process tool for establishing the deposition atmosphere 250 may correspondingly be cleaned by using process gases other than nitrogen-containing precursors and carrier gases. After a corresponding cleaning process or by using a process tool dedicated to nitrogen-free processes, in one particular embodiment, the deposition atmosphere 250 is created on the basis of carbon dioxide ($CO_2$) and silane ($SiH_4$) precursors. In some embodiments, it is advantageous to use helium as a carrier gas, while in other embodiments other gases, such as argon, may be used. A plasma may be excited in the deposition atmosphere 250 by supplying high frequency power, wherein, depending on the chamber geometry of the process tool used, the power of the high frequency as well as a distance of the deposition atmosphere 250 from the substrate 201 may be selected to obtain the required deposition rate. For instance, for the above-identified Producer™ system, the high frequency power may be adjusted to approximately 70-110 Watts with a spacing of a corresponding showerhead to the substrate 201 in the range of approximately 450-550 mils. A pressure within the deposition atmosphere 250 may, in one embodiment, be adjusted to the range of approximately 5.5-6.8 Torr or, in other embodiments, to approximately 6.3±0.5 Torr.

With the above-specified parameters, the thickness of the ARC layer 205 may be varied within a wide range of approximately 10-170 nm and, in particular embodiments, in the range of approximately 50-150 nm, wherein the thickness is advantageously controlled by the deposition time. Based on the above parameters, a deposition rate of approximately 100-140 nm per minute may be achieved. In one illustrative embodiment, the across-substrate non-uniformity of the ARC layer 205 may be maintained at approximately 1.5% or less.

The deposition process using the deposition atmosphere 250 may be preceded by one or more process steps for preparing the substrate 201 and the deposition atmosphere 250 to achieve a stable deposition process. The following processes and parameters may advantageously be used, in one particular embodiment, with the above-identified Applied Materials' Producer™ system.

First, a pumping process is performed at a pressure of approximately 0.3 Torr or less while adjusting a substrate temperature of approximately 300-430° C., and, in particular embodiments, approximately 350-400° C., wherein the temperature may be selected in conformity with subsequent process steps that may require an elevated substrate temperature.

After approximately 10 seconds and maintaining the temperature, the spacing of the substrate 201 with respect to a plasma sheath still to be established may be adjusted to approximately 500 mils, thereby heating up the substrate 201 for approximately 10 seconds.

Then, a pressure of approximately 6.3±0.5 Torr is established by introducing helium at a flow rate of approximately 2,500 sccm and carbon dioxide at a flow rate of approximately 4,500 sccm. This pre-deposition atmosphere may be stabilized for approximately 20 seconds.

Thereafter, silane as a second pre-cursor, in addition to carbon dioxide, is then introduced into the pre-deposition atmosphere at a flow rate of approximately 70 sccm to stabilize the pre-deposition atmosphere for approximately 5 seconds.

Then, high frequency power is applied to ignite a plasma, thereby creating the deposition atmosphere 250, while substantially maintaining the pressure and the flow rates of the carrier and precursor gases. In this particular embodiment, a single frequency power of approximately 90±10 Watts is applied without introducing any bias power. The deposition time depends on the required thickness of the ARC layer 205 and may be adjusted to approximately 30 seconds to obtain a thickness of 60±6 nm. In other embodiments, the thickness may be adjusted to approximately 70 or 120 nm, thereby providing an increased "optical decoupling" to the underlying dielectric layer 206.

Next, after the deposition phase, the supply of silane may be discontinued and the high frequency power may be slightly increased to approximately 110 Watts, while the process chamber is pumped more efficiently to slightly reduce the pressure to approximately 5.5 Torr.

After approximately 5 seconds of purging the process chamber with high frequency power, a pumping step may be carried out for approximately 10 seconds to substantially remove process byproducts.

As may certainly be appreciated, the above process recipe may be readily amended by a person skilled in the art so that it may be adapted to any other appropriate PECVD deposition tool available on the market.

For the above-specified parameters, the ARC layer 205 may have a thickness of approximately 60±6 nm, or approximately 70 nm or approximately 120 nm, with an across-substrate non-uniformity of less than approximately 1.5%, achieved by a deposition rate of approximately 120±12 nm/minute. The index of refraction is approximately 1.92±0.3, while the extinction coefficient is approximately 0.65±0.3 at 193 nm wavelength. It should be noted that the characteristics determining the optical behavior of the ARC layer 205, that is the thickness, the index of refraction and the extinction coefficient, may be varied by correspondingly controlling the deposition parameters. For instance, the ratio of silicon and carbon dioxide may be varied within a range of approximately 0.012-0.02 to adjust the index of refraction to a desired target value. However, other parameters, such as temperature and pressure, may be correspondingly adjusted to obtain the desired target value. One or more target values for one or more optical characteristics of the ARC layer 205 may be determined in advance, as will be described in more detail with reference to FIGS. 3a-3c.

After completion of the deposition of the ARC layer 205, which has been performed in a substantially nitrogen-free atmosphere, except for minute amounts of impurities, the ARC layer 205 is substantially free of nitrogen, apart from any impurities which may have diffused up from the underlying layer 206. Hence, in some embodiments, an additional capping layer (not shown) may be formed to substantially prevent any diffusion of nitrogen into the ARC layer 205 as will be described with reference to FIG. 2b. In other embodiments, the decreasing variation of the impurity level of nitrogen from a bottom surface to a top surface of the ARC layer 205 caused by up-diffusion may be considered acceptable since, due to a moderately large layer thickness, the surface contamination may still be within process margins.

Figure 2B:
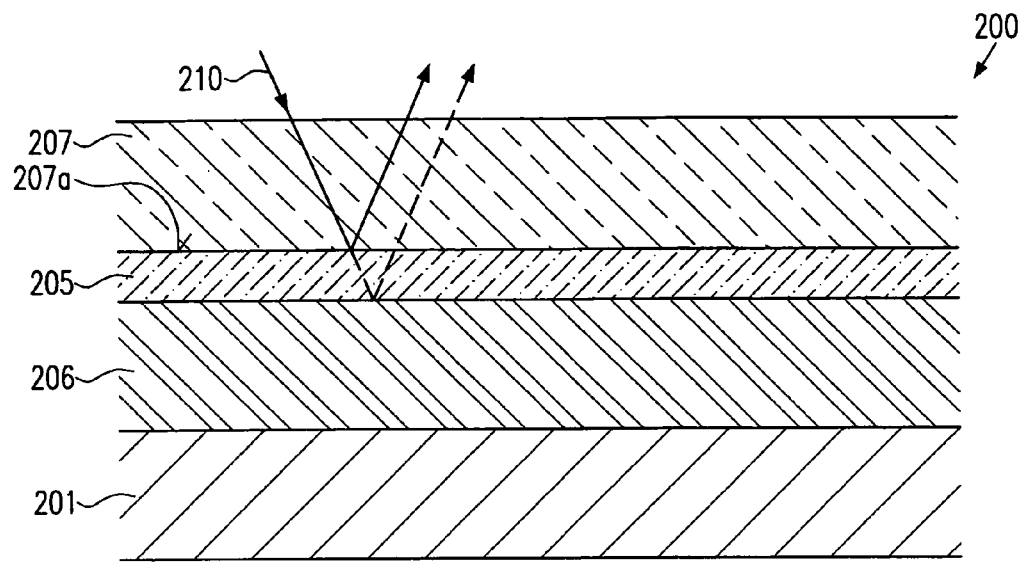

FIG. 2b schematically shows the semiconductor structure 200 with a resist layer 207 formed on the ARC layer 205. In embodiments relating to highly sophisticated semiconductor devices, the resist layer 207 may represent a photoresist designed for a 193 nm exposure wavelength. In one particular embodiment, the optical characteristics and the thickness of the ARC layer 205 are selected to maintain a back reflection of exposure radiation 210 from a bottom surface 207a of the resist layer 207 at approximately 3% and less. Moreover, the extinction coefficient and the layer thickness may be selected such that an influence of thickness variations of the dielectric layer 206 on the lithography using the exposure radiation 210 may be significantly reduced. That is, the optical characteristics of the ARC layer 205 are adjusted to maintain the back reflection below a specified level, for instance approximately 3%, even if the thickness of the layer 206 varies to effectively optically "decouple" the resist layer 207 and the ARC layer 205 from any underlying material layers. Reducing the thickness of the ARC layer 205 may result in a reduced reflectivity but may not provide the desired degree of decoupling. The increased optical decoupling may be achieved by selecting the extinction coefficient and the layer thickness of the ARC layer 205 to be moderately high, as will also be explained with reference to FIGS. 3a-3c.

Figure 2C:
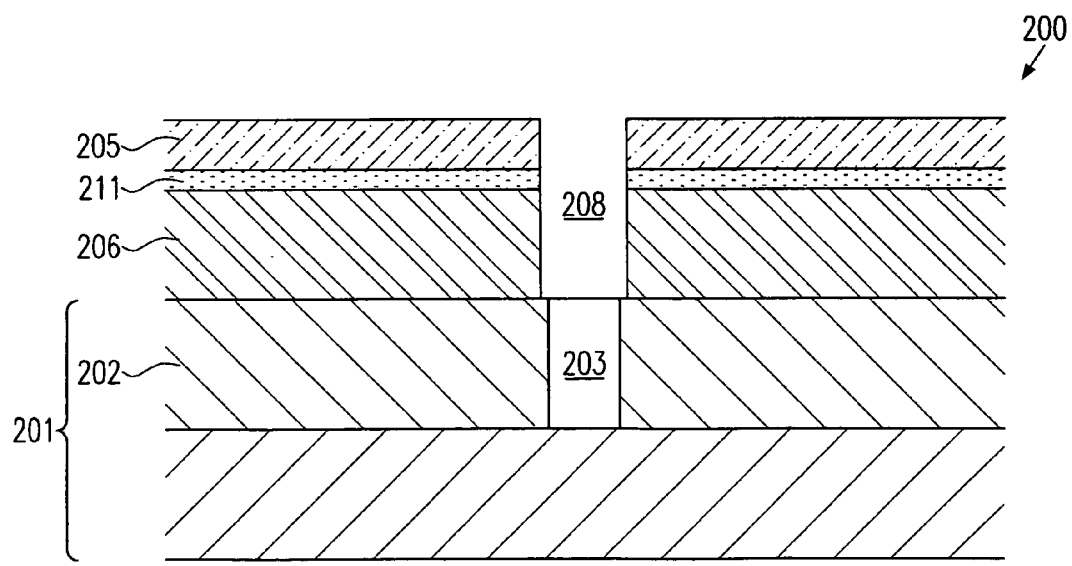

FIG. 2c schematically shows the semiconductor structure 200 in a further advanced manufacturing stage, wherein, in FIG. 2c, the semiconductor structure 200 is shown to include a metal-containing contact portion 203 in a dielectric layer 202. For instance, the dielectric layer 202 may represent an interlayer dielectric for contacts of circuit elements. Hence, the contact portion 203 may include a metal, such as tungsten, cobalt, aluminum, copper, and the like, possibly provided in the form of compounds and alloys. Moreover, contrary to FIGS. 2a and 2b, a capping layer 211 is explicitly illustrated on top of the dielectric layer 206, wherein, in one particular embodiment, the capping layer 211 may be substantially comprised of silicon dioxide. In other embodiments, the capping layer 211 may be comprised of other suitable materials, such as polymer materials and the like. In one illustrative embodiment, the capping layer 211 may have substantially the same material composition as the ARC layer 205, and may thus be formed in a substantially nitrogen-free atmosphere so that the capping layer 211 may act as an efficient "buffer" for any nitrogen diffusing up from the dielectric layer 206 while at the same time reducing the potential for a nitrogen contamination. Moreover, an opening or trench 208 is formed in the ARC layer 205, the capping layer 211, and the dielectric layer 206 that is in contact with the contact portion 203 and which may receive a metallization metal such as copper and the like.

Figure 1B:
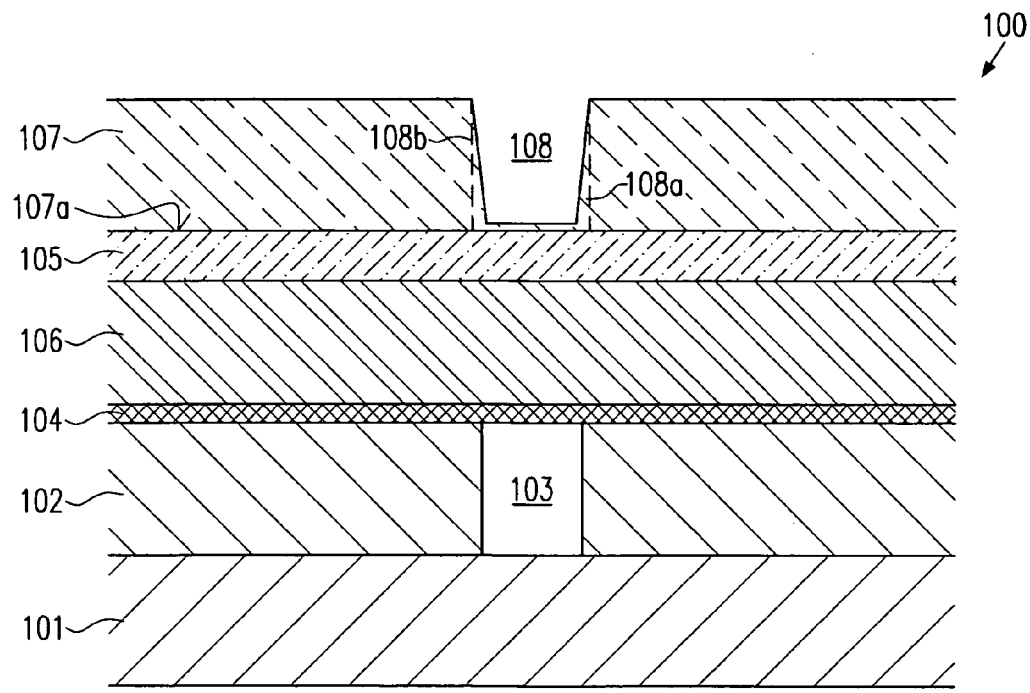
Figure 1C:
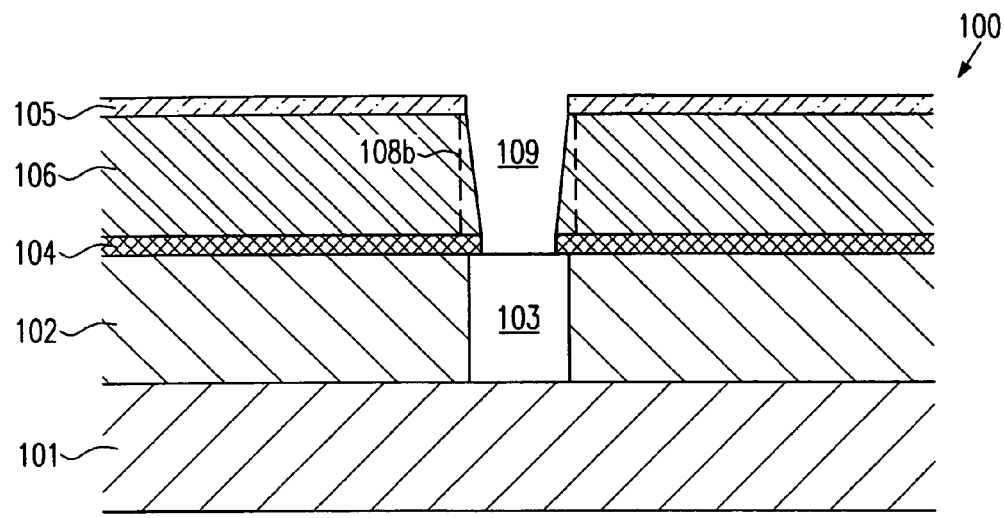

The semiconductor structure 200 as shown in FIG. 2c may be formed by the following processes. The layer 202 and the contact portion 203 may be formed by well-established processes, as are also described with reference to FIGS. 1a-1c. The dielectric layer 206 may be formed as previously explained with reference to FIGS. 2a-2b, wherein, in some embodiments, the capping layer 211 may be formed as a silicon dioxide layer by altering the deposition parameters in a final phase of the deposition process for forming the dielectric layer 206 when comprised of SiCOH. In other embodiments, a silicon dioxide layer may be deposited in a separate deposition step, especially when the dielectric layer 206 is formed by spin-on techniques. In a further illustrative embodiment, after forming the dielectric layer 206 by any appropriate technique, a first deposition process may be performed as previously described with reference to FIG. 2b for the layer 205, wherein the deposition parameters are selected to provide an efficient nitrogen barrier and a mechanically stable surface region for the dielectric layer 206. Since the deposition is performed in a deposition atmosphere based on carrier and precursor gases without nitrogen, the amount of nitrogen accumulating within the capping layer 211 is significantly less compared to a silicon dioxide formation process on the basis of the carrier and precursor gases as may typically be used when depositing an SiCOH layer. Thereafter, the ARC layer 205 may be formed as previously described, wherein, in some embodiments, it may be sufficient to efficiently purge the process chamber prior to starting the deposition of the ARC layer 205. In other embodiments, a separate deposition tool may be used to substantially avoid any nitrogen accumulation caused by tool contamination. In some embodiments, the capping layer 211 may be deposited as a portion of the ARC layer 205, such that the overall optical characteristics of the layers 205 and 211 in combination may provide the desired anti-reflective behavior, while, in other cases, the capping layer 211 may act as a buffer layer and may thus have different optical characteristics compared to the layer 205, which serves to decouple the underlying substrate.

Based on the superior characteristics of the ARC layer 205, possibly in combination with the capping layer 211, the resist layer may be patterned and the corresponding resist mask may be used for forming the opening or trench 208 in accordance with process specifications, wherein the effect of resist poisoning may be significantly reduced. During a corresponding etch process for forming the opening 208, the ARC layer 205 may serve as an etch mask after the resist may have been "consumed" by the etch process, wherein the ARC layer 205 also provides increased etch selectivity compared to nitrogen-depleted conventional ARC layers formed by spin-on techniques.

As previously explained, the optical characteristics of the ARC layer 205 may be selected in advance for a desired optical behavior during a sophisticated photolithography process so that corresponding process parameters may be selected on the basis of the desired target value of one or more optical characteristics.

Figure 3A:
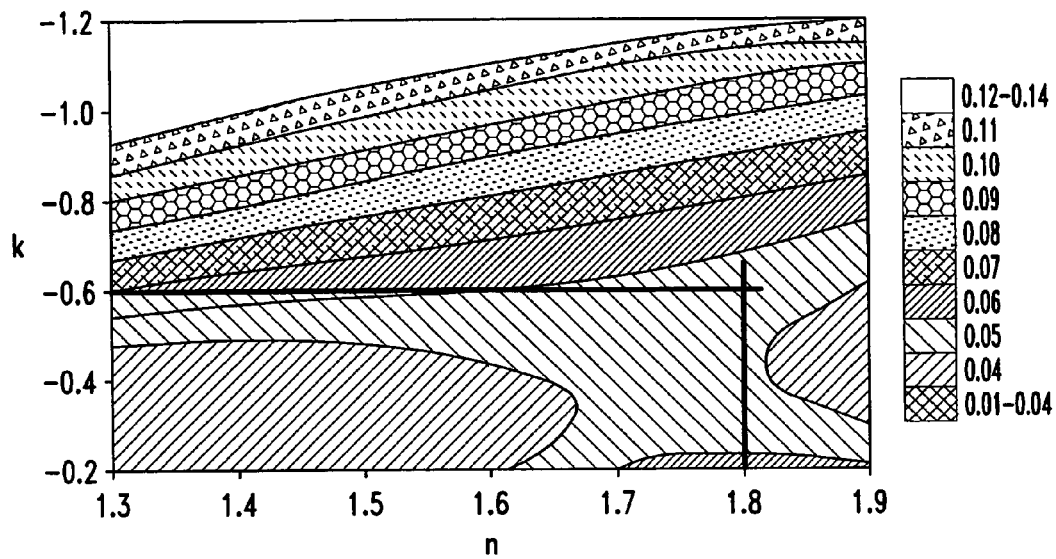
FIGS. 3a-3c schematically show graphs representing results of simulation calculations to establish appropriate target values for one or more optical characteristics of a nitrogen-free ARC layer in accordance with illustrative embodiments of the present invention.

FIG. 3a represents a graph depicting the relationship between the extinction coefficient k (vertical axis) and the index of refraction n (horizontal axis) for a varying degree of reflection R (gray scales) from the bottom surface 207a of the resist layer 207. The results shown are based on a corresponding simulation calculation. The calculations are based on a thickness of 45 nm for the ARC layer 205. A relatively high value for the extinction coefficient is selected to decouple the optical behavior of the ARC layer 205 and the resist layer 207 from the underlying substrate. However, as is indicated for a value of 0.6 for the extinction coefficient, the reflectivity is still approximately 5%.

Figure 3B:
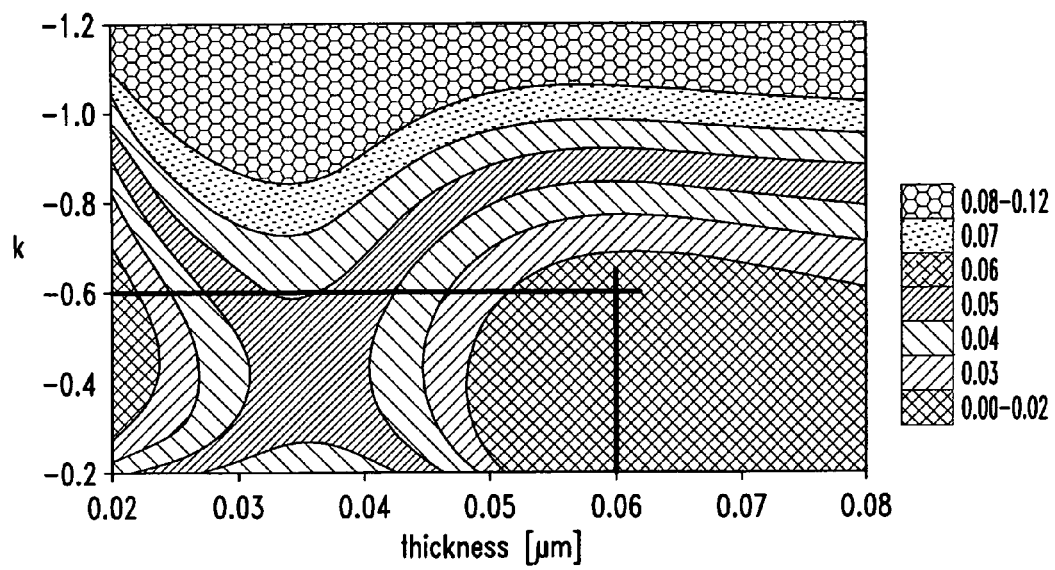

FIG. 3b schematically shows the dependency of the extinction coefficient k (vertical axis) from the layer thickness (horizontal axis) on the basis of the intensity reflected from the resist bottom surface 207a (gray scales). As is indicated by FIG. 3b, increasing the layer thickness to approximately 60 nm may lead to a reduced reflectivity of approximately 3% at a desirably high extinction coefficient of approximately 0.6.

Figure 3C:
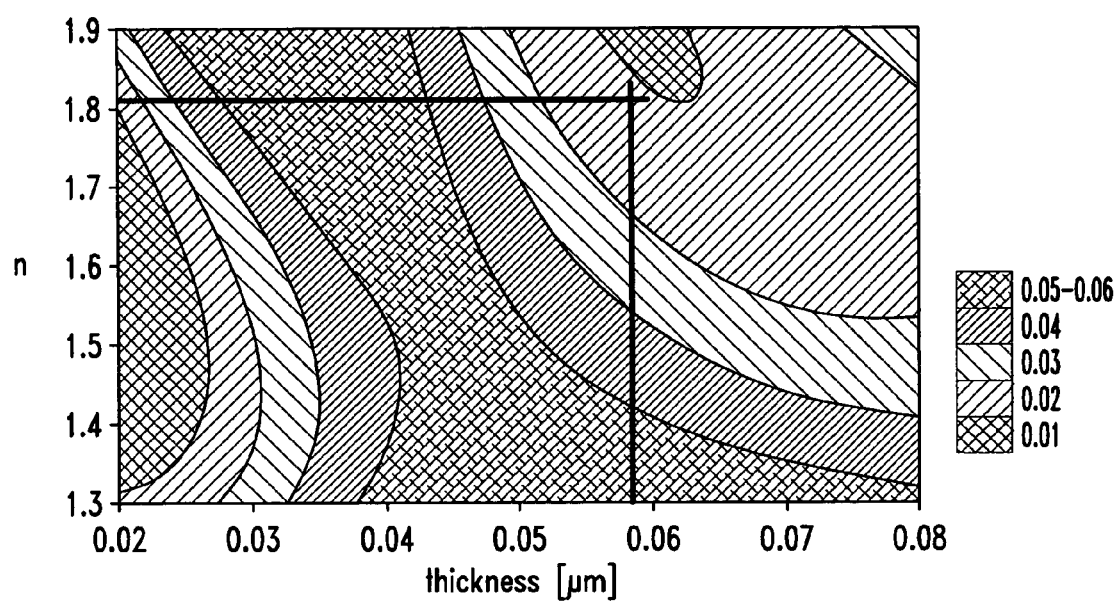

FIG. 3c shows a graph depicting the dependency of the index of refraction n (vertical axis) with respect to the layer thickness (horizontal axis) and the resulting reflected intensity (gray scales). As may be seen, an index of refraction of approximately 1.8 may be selected at the layer thickness of approximately 60 nm to obtain a reflectivity of approximately 2-3%. Thus, target values for the index of refraction, the extinction coefficient and the layer thickness of approximately 1.8, 0.6 and 60 nm, respectively, may be selected for a lithography process based on a 193 nm exposure wavelength. It should be appreciated that other target values may be selected depending on process requirements. In particular, if a different exposure wavelength is to be used, the corresponding simulation calculations have to be based on the desired exposure wavelength.

Based on these target values, the deposition parameters, for instance, the deposition time for the layer thickness, the ratio of silane to carbon dioxide for the index of refraction and the extinction coefficient, and the like, may be adjusted to obtain the required optical characteristics. A correlation between one or more process parameters and one or more target values for the optical characteristics of the ARC layer 205 may be established on the basis of corresponding test runs. For instance, one process parameter may be varied, for example the precursor ratio, for a plurality of substrates, and corresponding optical measurement data may be gathered to estimate the influence of the specified process parameter on the finally obtained optical characteristics. In other embodiments, the variations of the lithography process of product and test substrates may be analyzed on the basis of process variations detected in the deposition process to obtain a correlation between the optical characteristics and deposition parameters.

As a result, the present invention provides an improved technique for a substantially nitrogen-free ARC layer that is particularly advantageous in combination with a 193 nm lithography. In addition to a significantly reduced poisoning effect, the substantially nitrogen-free ARC layer also exhibits an improved etch selectivity with respect to an underlying dielectric material compared to spin-on ARC layers, as are frequently used in conventional processes. Moreover, the technique described herein provides a high degree of flexibility in adapting the optical characteristics of the substantially nitrogen-free ARC layer to lithography and other process requirements, while maintaining production costs at a low level as available PEVCD tools may be efficiently used.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   determining a target value for at least one optical characteristic for an ARC layer to be formed above an interlayer dielectric of a metallization layer, such that a bottom reflectivity of a resist layer formed on said ARC layer is approximately 3% or less; and
   depositing said ARC layer in a substantially nitrogen-free atmosphere on the basis of silicon and carbon containing precursors above said interlayer dielectric while controlling at least one process parameter on the basis of said target value, wherein said at least one process parameter comprises a ratio of said silicon containing precursor and said carbon containing precursor in the range of approximately 0.012 to 0.020.

2. The method of claim 1, wherein said substantially nitrogen-free atmosphere includes a plasma.

3. The method of claim 1, wherein said precursors comprise silane.

4. The method of claim 3, wherein said precursors comprise carbon dioxide gas.

5. The method of claim 1, wherein said target value for said at least one optical characteristic is selected for an exposure wavelength of approximately 193 nm.

6. The method of claim 1, wherein said target value for said at least one optical characteristic represents an extinction coefficient that is within a range of approximately 0.35 to 0.95.

7. The method of claim 1, wherein said target value for said at least one optical characteristic represents an index of refraction that is within a range of approximately 1.72 to 2.12.

8. The method of claim 1, wherein depositing said ARC layer is controlled to obtain a layer thickness in the range of approximately 50-150 nm.

9. The method of claim 8, wherein a layer thickness of said ARC layer is approximately 60±6 nm.

10. The method of claim 8, wherein a layer thickness of said ARC layer is approximately 70 nm.

11. The method of claim 8, wherein a layer thickness of said ARC layer is approximately 120 nm.

12. The method of claim 1, wherein a flow rate of said carbon containing precursor is approximately 5000 sccm or less.

13. The method of claim 1, wherein a pressure in said nitrogen-free atmosphere is in the range of approximately 6.0 to 6.6 Torr.

14. The method of claim 1, wherein a temperature of a substrate having formed thereon said interlayer dielectric is in the range of approximately 300-430° C. during the deposition of said ARC layer.

15. The method of claim 1, wherein a temperature of a substrate having formed thereon said interlayer dielectric is in the range of approximately 350-400° C. during the deposition of said ARC layer.

16. A method of forming a substantially nitrogen-free ARC layer, the method comprising:
   creating a deposition atmosphere on the basis of a silicon containing precursor, carbon dioxide and a nitrogen-free carrier gas, wherein a ratio of said silicon containing precursor and the carbon dioxide is in the range of approximately 0.012 to 0.020;
   generating a plasma in said deposition atmosphere; and
   depositing at least silicon, oxygen and carbon on a substrate to form said substantially nitrogen-free ARC layer, wherein target values for an index of refraction, an extinction coefficient and a layer thickness of said ARC layer are selected to obtain a back reflection from a bottom surface of a resist layer formed on said substantially nitrogen-free ARC layer that is 3% or less for an exposure wavelength of approximately 193 nm.

17. The method of claim 16, further comprising determining a target value of at least one optical characteristic of said substantially nitrogen-free ARC layer and controlling at least one deposition parameter on the basis of said target value.

18. The method of claim 17, wherein said target value for said at least one optical characteristic is determined for an exposure wavelength of a subsequent lithography of approximately 193 nm.

19. The method of claim 16, further comprising forming an interlayer dielectric for a metallization layer prior to depositing said substantially nitrogen-free ARC layer.

20. The method of claim 19, wherein forming said interlayer dielectric includes forming a capping layer on a top surface of said interlayer dielectric.

21. The method of claim 20, wherein said capping layer is formed on the basis of nitrogen-free precursors.

22. The method of claim 19, wherein said metallization layer is the first one of a plurality of metallization layers to be formed.

23. The method of claim 16, wherein a flow rate of said carbon dioxide is approximately 5000 sccm or less.

24. The method of claim 16, wherein a pressure in said deposition atmosphere is in the range of approximately 6.0 to 6.6 Torr.

25. The method of claim 16, wherein a temperature of said substrate is in the range of approximately 300-430° C. during the deposition of said ARC layer.

26. The method of claim 16, wherein a temperature of said substrate is in the range of approximately 350-400° C. during the deposition of said ARC layer.

27. The method of claim 16, wherein at least one of high frequency energy for generating said plasma, a substrate temperature, a pressure in said deposition atmosphere and a flow rate of gases supplied to said deposition atmosphere is selected to obtain a deposition rate in the range of approximately 100-140 nm per minute.

* * * * *